United States Patent
La Rosa et al.

(10) Patent No.: US 6,476,632 B1
(45) Date of Patent: Nov. 5, 2002

(54) RING OSCILLATOR DESIGN FOR MOSFET DEVICE RELIABILITY INVESTIGATIONS AND ITS USE FOR IN-LINE MONITORING

(75) Inventors: Gluseppe La Rosa, Fishkill, NY (US); Fernando Guarin, Millbrook, NY (US); Kevin Kolvenbach, Walden, NY (US); Stewart Rauch, III, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 09/599,785

(22) Filed: Jun. 22, 2000

(51) Int. Cl.[7] .................................................. G01R 31/26
(52) U.S. Cl. ....................................................... 324/769
(58) Field of Search ................................. 324/603, 765, 324/767, 768, 769, 158.1; 331/57, 105, 108 A, 177 R; 327/264, 272, 276, 278

(56) References Cited

U.S. PATENT DOCUMENTS

| | | | |
|---|---|---|---|
| 4,795,964 A | * 1/1989 | Mahant-Shetti et al. | .... 324/603 |
| 5,095,267 A | 3/1992 | Merill et al. | |
| 5,341,096 A | 8/1994 | Yamamura | |
| 5,457,400 A | 10/1995 | Ahmad et al. | |
| 5,625,288 A | 4/1997 | Snyder et al. | |
| 5,677,650 A | * 10/1997 | Kwasniewski et al. | ..... 331/105 |
| 5,818,215 A | 10/1998 | Miyamae et al. | |
| 5,995,428 A | 11/1999 | Chien et al. | |
| 6,133,799 A | * 10/2000 | Favors et al. | ................ 327/264 |

OTHER PUBLICATIONS

G. La Rosa, et al., "NBTI channel hot carrier effects in PMOSFETs in advances CMOS technologies", published by IPRS, 1997; No available month.

R. Woltjier, et al., "New hot carrier degradation mechanisms in 0.25 ums. PMOSFETs", 1994 Symposium on VLSI Technology; No available month.

S. Rauch, et al., "Impact of E.E. scattering to the hot carrier degradation of deep sub–micron NMOSFETs", EDL vol. 19, No. 12, Dec. 1998.

B. Marchand, et al., "Generation of hot carriers by secondary impact ionizaiton in deep sub–micron devices: model and light emission characteristics", IPRS 2000, No available month.

* cited by examiner

Primary Examiner—Michael Sherry
Assistant Examiner—Minh N. Tang
(74) Attorney, Agent, or Firm—H. Daniel Schnurmann (57) ABSTRACT

A method of determining the effect of the degradation of MOSFET on the frequency of a Ring Oscillator (RO) consisting of an odd prime number of inverter stages, each of the inverters stages having an NMOS and a PMOS field-effect transistor is described. The method includes the steps of: a) selecting one inverter from the inverter stages of the RO, the selected inverter having testable nodes, the testable nodes being connected to inputs and outputs of the NMOS and a PMOS field-effect transistors (FET) forming the selected inverter; b) simultaneously stressing under a set of stress conditions 1) all of the NMOS FETs of each of the inverter stages, 2) all of the PMOS FETs, and 3) all of the NMOS FETs and PMOS FETs in the RO; c) measuring a shift in selected device parameters in the selected inverter; d) measuring a frequency degradation of the entire RO; and e) establishing a relationship between the shift in the device parameters and the frequency degradation and relating the relationship to a known degradation mechanism Furthermore, on-chip pass gates controlled by appropriate off-chip DC voltage signals, allow parallel DC stressing, as well as forcing an off-chip AC voltage waveform to a given MOSFET type device (either PMOSFET or NMOSFET) on every inverter stage of the RO. The RO circuit makes it possible to investigate the effect on the RO frequency degradation, caused by any DC MOSFET degradation mechanism as well as by any external AC voltage waveform known to be representative of a critical circuit operation. Thus, the dependence of the RO frequency on device degradation mechanisms activated during a critical circuit operation can be carefully investigated and quantified.

13 Claims, 9 Drawing Sheets

Repeat the circled procedure as many times as needed during the RO stress.

RING OSCILLATOR DESIGN FOR MOSFET DEVICE RELIABILITY INVESTIGATIONS AND ITS USE FOR IN-LINE MONITORING

FIELD OF THE INVENTION

This invention is generally related to ring oscillators (RO) and, more particularly, to an RO that allows parallel stressing of MOSFET devices in each of its inverter stages under any set of DC or AC voltage bias conditions.

BACKGROUND OF THE INVENTION

In recent years, the information technology industry has experienced an extremely rapid growth thanks to the availability in the market of semiconductor chips with larger density, higher performance and more complex chip functions availability. One of the main contributors to this growth is the recent advance in deep sub-micron CMOS technology development. To meet the requirements of high performance microprocessors (i.e., 1 Ghz and above), the storage capacity of advanced DRAMs (1 Gbit and above) as well as the large function complexity of chips such as EDRAM or SOC, there is a need for more aggressive CMOS transistor devices. New NMOSFET and PMOSFET features have been introduced at a very fast rate. MOSFETs having a very thin gate oxide and different gate oxide processes such as nitride or deuterate oxides have been implemented. Aggressive shallow junction drain engineering such as LDD, extension and halo implants have helped to reduce the short channel effects that otherwise will be experienced, which may limit the use of deep sub-micron MOSFETs (less than 0.1 um).

An important element affecting the applicability of a given sub-micron CMOS technology to the aforementioned chip requirements is its level of reliability. In particular, it is considered critical to ensure that fundamental MOSFET device wear-out mechanisms such as hot carrier (HC) or negative bias temperature instability (NBTI) are not a limiting factor when shrinking the transistor size. This concern has prompted, among others, a big effort in technology reliability to carefully quantify the tradeoff between chip performance and MOSFET device reliability. Special focus has been given to better evaluate the link between the results of the device reliability DC stresses, typically run during the technology qualification activities and the expected end of life chip performance degradation due to the activation of possible MOSFET wear-out mechanisms. The need of reducing the technology qualification cycles to meet aggressive market demands has also forced the introduction of wafer level reliability (WLR) methodologies, mainly to quickly characterize these MOSFET reliability failure mechanisms providing the same level of confidence as in standard technologies qualification methodologies.

Figure 1:
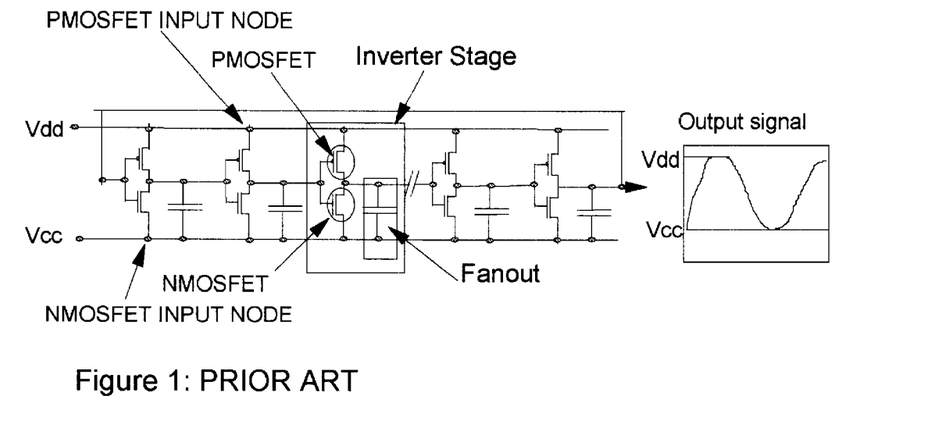
FIG. 1 shows a conventional basic oscillator circuit consisting of cascaded inverter stages with a given fan-out, with the stages closed in a loop.

Conventional Ring Oscillators (RO) are simple circuits formed by an odd prime number of CMOS inverters connected in cascade to form a loop. The odd prime number of inverters in series allows the output signal of the RO to oscillate ("ring") between the power supply rail Vdd and the ground rail Vcc. Each inventor consists of two enhancement-mode MOSFET transistors, respectively, a pull-down NMOSFET transistor and a pull-up PMOSFET transistor. The ringing frequency depends on the output junction/capacitance load (fan-out) of each inverter stage, as shown in the conventional RO circuit illustrated in FIG. 1. The RO frequency has been traditionally considered an effective vehicle for monitoring the dependence of the chip performance on the MOSFET design used as well as on the fan-out loading scheme simulating the output RC of the circuit.

Since the RO frequency increases with an increasing Vdd, it possible to stress a typical RO circuit by applying a sufficiently large Vdd. At high Vdd bias conditions, the high frequency periodic oscillations will accelerate the degradation of both the NMOSFET and PMOSFET devices in each inverter stage and the subsequent degradation of the RO frequency. Several works, for example, have reported a correlation between the NMOSFET device degradation of the drain current in saturation conditions and the RO frequency degradation during RO stressing by high frequency ringing.

A challenging outcome of the MOSFET down scaling is that the aggressive MOSFET device design and process used in sub-micron technologies activate new device degradation mechanisms that were not observed in the past. This finding limits the applicability of traditional RO designs as stress vehicles to characterize the link between the required chip performance, parameterized by the RO frequency degradation, and MOSFET reliability wear-out mechanisms, investigated at DC conditions, in deep sub-micron technologies.

Figure 2:
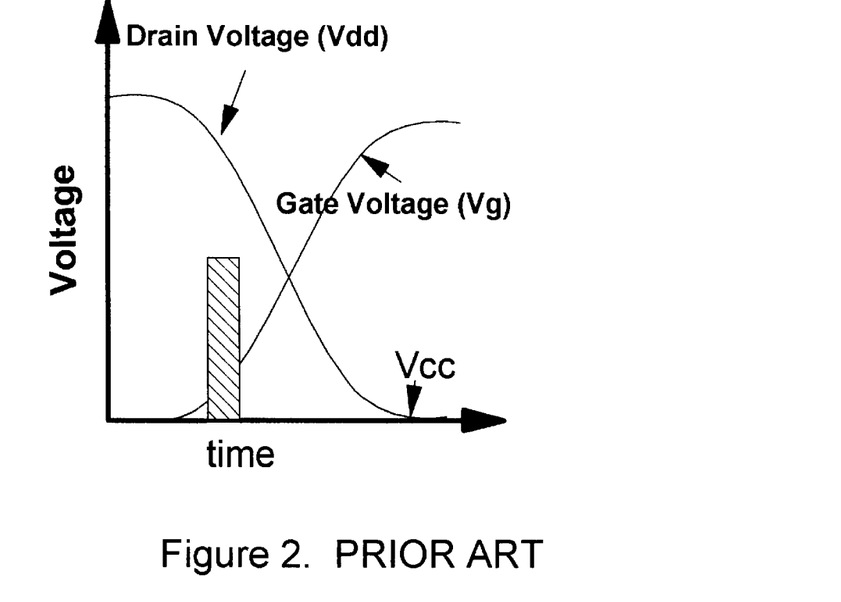
FIG. 2 shows the drain and gate voltage waveform applicable to an NMOSFET device when operating a typical RO. The dashed area represents the time region of the waveform during which the hot carrier damage is created within the device (Peak Substrate Condition).
Figure 3:
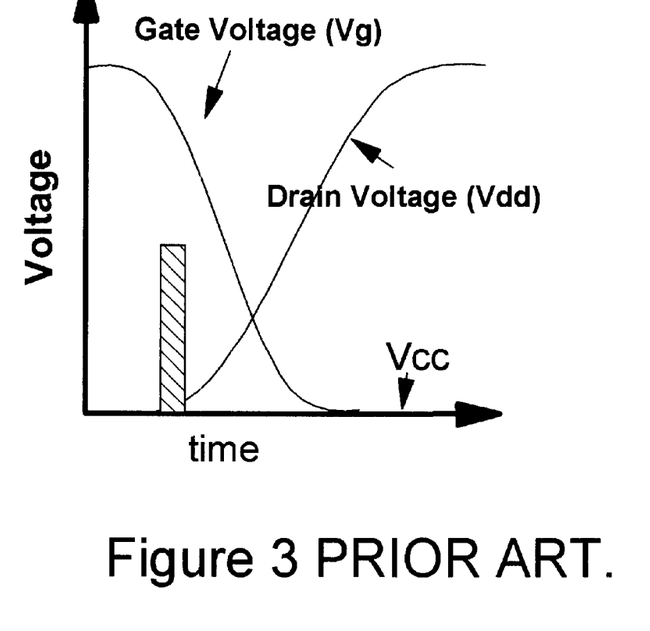
FIG. 3 shows the drain and gate voltage waveform applicable to a PMOSFET device during the operation of a typical RO. The dashed area represents the time region of the waveform during which the hot carrier damage is created in the device. (Peak Gate Condition).

With standard RO designs it is only possible to measure the cumulative contribution of all possible device degradation mechanisms which are activated during an RO periodic waveform to the RO frequency degradation. Standard RO designs, in fact, make it possible to investigate the RO frequency degradation dependence on periodic RO voltage waveforms. It has been found in previous LSI CMOS technologies (0.25 um ground rule and above) that this frequency degradation was due to hot carrier worst case degradation during AC transients which correspond to a peak substrate current (Isx) condition for the NMOSFET, which damage is controlled by interface states generation, and a peak gate current (Igate) condition for the PMOSFET, which damage is controlled by electron trapping, as shown in prior art FIGS. 2 and 3. It is, however, not easy to decouple the contribution of each failure wear-out activated during the AC waveform to the RO frequency degradation.

Additionally, because all ROs generate only AC periodic waveforms, typical RO circuits do not allow to quantify and isolate the impact to the RO frequency degradation from other possible device degradation mechanisms, that are not activated by periodic voltage waveforms, but which are possible contributors to the performance degradation in real circuits.

Figure 4:
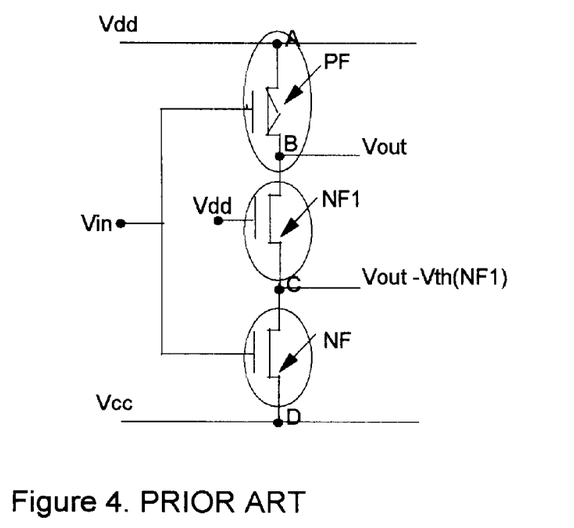
FIG. 4 shows an inverter stage with a buffer NMOSFET device. This circuit is an example of impact of electron trapping and interface states generation to the degradation of the NMOSFET (NF) device during the operation of a conventional RO having this inverter as its basic invert stage element.

A simple example of this situation is shown by the circuit described in FIG. 4. The circuit consists of an inverter stage (ISB) consisting of a PMOSFET device (PF) and a pair of NMOSFET devices (NF and NF1) in series. The gate of the NF1 device is set to Vg=Vdd to ensure that this device is always on. With the input of the inverter stage (Vin) swinging between 0 and Vdd, its output (Vout) follows between Vdd and 0. Node C will swing between 0 and Vout−Vth (NF1), wherein Vth(NF1) is the Vth of the NF1 device. Under these conditions the maximum Vds(NF) across NF is Vdd−Vth(NF1), while its maximum Vgs(NF) is Vdd.

Figure 5:
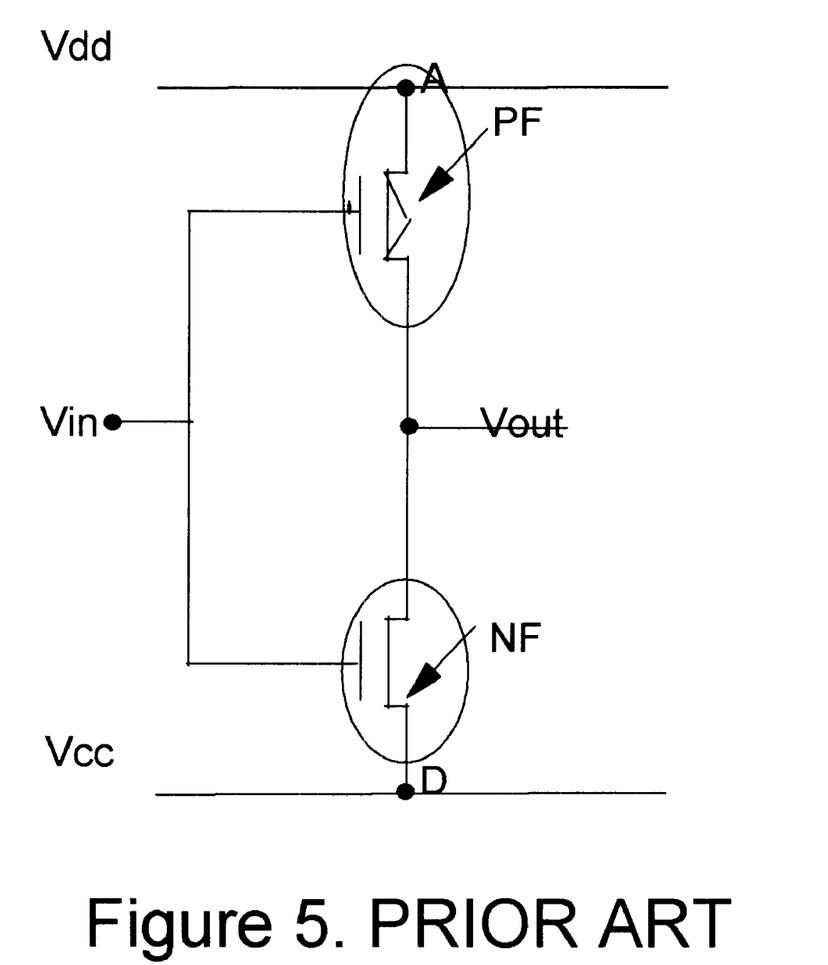
FIG. 5 shows a conventional inverter stage. This circuit is an example of interface states generation to the degradation of the NMOSFET (NF) device during the peration of a conventional RO circuit having this inverter as its basic invert stage element.
Figure 6:
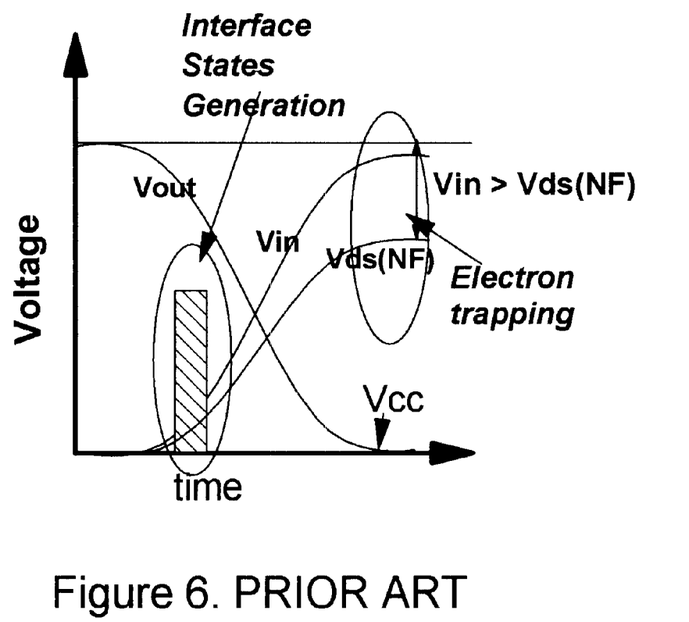
FIG. 6 shows an NMOSFET device damage mechanisms in an inverter stage with a buffer NMOSFET (shown in FIG. 4) during the operation of a conventional RO circuit having this inverter as its basic invert stage element.
Figure 7:
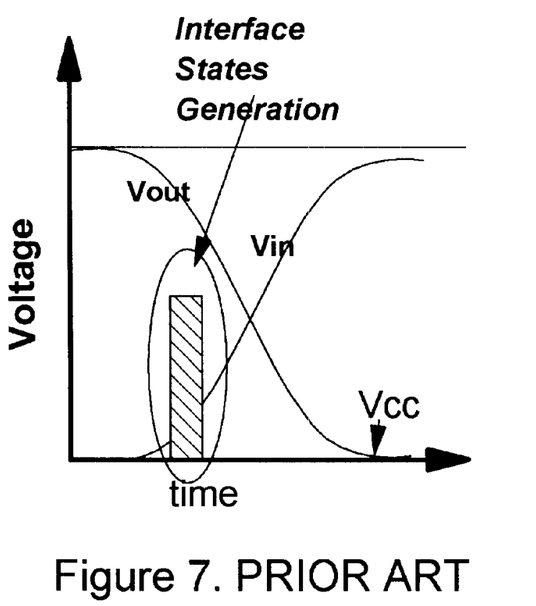
FIG. 7 NMOSFET device damage mechanisms in an inverter stage (see FIG. 5) during the operation of a conventional RO having this inverter as its basic invert stage element.

The condition Vgs(NF) >Vds(NF) is possible in this situation, but it is not possible in the simple inverter scheme (IS) depicted in FIG. 5. In the case shown, Vgs(NF) is always smaller or equal to Vdd. Because of the different relationship of Vgs(NF) relative to Vds(NS) for each of these inverters, the NMOSFET (NF) device in each inverter is expected to be sensitive to different degradation mechanisms. The NF device of the simple invert circuit (IS) is only sensitive to the interface states generation damage with Vgs=@ peak Isx (FIG. 5), while the same device in the inverter circuit in FIG. 4 (ISB) is sensitive to interface states generation with Vgs at peak Isx and electron trapping at Vgs(NF) >Vds(NF). The former damage produces channel mobility degradation, while the latter parasitic drain series resistance increases, as described in the article by S. K. Manhas et al, "Early stage hot carrier degradation of state of art Iss NMOSFETs", IPRS 2000.

The frequency degradation of an RO consisting of cascaded inverter stages (IS) is controlled by the interface states generation damage taking place in NMSOFET device during the RO "ringing", while the frequency degradation of an RO consisting of inverter stages (ISB) will have contributions from both the interface states generation as well as electron trapping. In the latter circuit, it is not possible to decouple the contribution of each mechanism to the RO frequency degradation. Therefore, it is not easy to quantify the individual contribution of each mechanism to the RO degradation. Thus, this illustrates an actual real circuit performance degradation that cannot be detected by standard RO stressing with inverter stages such as IS.

The previously described situation becomes even more complex in sub-micron CMOS technologies. New CMOS device degradation mechanisms such as negative bias temperature instabilities (NBTI), as described by G. La Rosa et al., "NBTI channel hot carrier effects in PMOSFETs in advances CMOS technologies", published by IPRS 1997, it is known that non-conducting/standby effects, electron trapping/hole injection in NMOSFETs or interface state generation in PMOSFETs, which are described by R. Woltjer et al. in an article entitled "New hot carrier degradation mechanisms in 0.25 $\mu$ms. PMOSFETs", 1994 Symposium on VLSI Technology; electron to electron scattering, described by S. Rauch et al., in the article entitled "Impact of E.E scattering to the hot carrier degradation of deep sub-micron NMOSFETs", EDL, Vol 19, No. 12, December 1998; as well as secondary impact ionization during conductive channel hot carrier, described by B. Marchand et al, "Generation of hot carriers by secondary impact ionization in deep sub-micron devices: model and light emission characteristics", IPRS 2000. All of these have been observed recently in DC reliability investigations of deep sub-micron CMOS technologies and are considered strong contributors to circuit performance degradation in real circuit operations.

Although these mechanisms may not be fully activated during a typical RO stressing, they may produce a strong impact in specific circuits, such as world line drivers, off-chip drivers, and the like. In this case it becomes important to carefully monitor the device degradation mechanism during the RO frequency degradation aging, in order to establish a one to one correlation between a particular MOSFET degradation mechanism and the RO frequency degradation, known as a figure of merit of the circuit performance.

Another drawback of the use of standard RO designs is that measurable frequency shifts during periodic RO AC stresses require very long term stresses. This effect is the result of the very small duty cycles associated with the transients during which the device damage is assumed to take place. Because of long stress times (100–1000 hours), RO investigations of the reliability at wafer level (WLR) are very difficult to implement. A possible use of standard RO circuits to quantify in-line monitoring of the impact of hot carrier enhancing manufacturing processes to the RO frequency degradation is typically unrealistic. Due to the very small duty cycles, RO stressing is normally carried out at package level to allow a long term stress and to measure significant RO frequency shifts.

The prior art in the field of using ring oscillator circuits to evaluate the AC reliability of a given chip basically relies on techniques to increase the RO frequency to force an AC periodic waveform to accelerate reliability failure mechanisms at burn-in and WLR conditions. This approach is the subject of several patents, e.g.:

U.S. Pat. No. 5,625,288, which describes an on-chip RO which frequency is controlled by a DC off-chip signal to stress special test structures that are used to provide information on a variety of reliability failure modes in WLR investigations. U.S. Pat. Nos. 5,995,428 and 5,457,400 which use ROs as part of burn-in stress circuits that allow the reduction of reliability defects by wafer level burn-in.

U.S. Pat. No. 5,341,096, wherein RO circuits are part of self-contained scan circuits to implement dynamic burn-in on LSI chips.

Several patents actually use ROs as monitors of in-line process variations that determine reliability fails in the field. By way of example:

U.S. Pat. No. 5,818,215 provides an RO containing a critical path of a semiconductor chip. Since the RO frequency is sensitive to process variations, the speed of the semiconductor chips under test can be investigated.

U.S. Pat. No. 5,095,267 provides an RO in a process monitor circuit to characterize the AC chip performance by DC measurements.

OBJECTS OF THE INVENTION

It is another object of Accordingly, is an object of the present invention to provide an RO circuit which frequency degradation can be induced by MOSFET device reliability wear-out mechanisms activated by an externally applied DC or AC voltage, and not limited to on-chip generated periodic RO waveforms. the present invention to provide a Ring Oscillator design to determine the dependence of the degradation of the RO frequency. (This is a typical measure of CMOS circuit performance on any possible DC MOSFET device degradation mechanism, that can be experienced by PMOSFET and NMOSFET devices in a real circuit operation using advanced sub-micron CMOS technologies).

It is a further object of the invention to provide an RO circuit, which frequency degradation is attained by parallel DC voltage biasing of each NMOSFET or PMOSFET device in each inverter stage of the RO. This biasing scheme is accomplished by appropriate parallel activation of an array of pass-gates in each inverter stage, by which any possible voltage bias is applied to the MOSFET of interest. Using this RO, it is possible to correlate the RO frequency degradation to a given device degradation mechanism (electron/hole injection, interface states generation, NBTI etc.), including those that are not typically activated by typical on-chip generated RO AC periodic waveforms.

It is another object of the present invention to provide a Ring Oscillator design which allows parallel stressing of a given MOSFET type device in each of its inverter stages at any off-chip applied AC voltage signal of interest. This RO circuit can be used to quantify the correlation between a particular externally applied AC waveform and the RO frequency degradation. In this manner, it is possible to evaluate the impact to the performance degradation of critical circuits in a chip of a specific applied AC waveform which may be experienced during real operations.

It is still another object of this invention to provide a Ring Oscillator circuit with an inverter stage (IS-Y in FIG. 5) wherein both the NMOSFET and PMOSFET devices can be directly probed for DC testing to monitor the degradation of key device parameters (such as the drain current, the threshold voltage etc.) during the frequency degradation of the RO induced by the externally applied DC or AC stress conditions.

It is a yet a further object of the present invention to provide a RO circuit which provides in-line monitoring of processes, and MOSFET device design options that are sensitive to a specific device failure mechanism and quantify their impact to the RO frequency degradation. Worst case DC voltage bias short term stresses (less then 10 sec) can be run in an in-line WLR approach to significantly degrade a given MOSFET in each inverter stage of the RO, producing sufficiently large frequency degradation of the RO in a reasonable short time to justify the use of this RO circuit for in-line monitoring.

SUMMARY OF THE INVENTION

In one aspect of the invention, there is provided an on-chip set of pass gates, controlled by appropriate off-chip DC voltage signals, to allow parallel DC stressing, as well as forcing an off-chip AC voltage waveform to a given MOSFET type device (either PMOSFET or NMOSFET) in every inverter stage of the RO. The RO circuit of the present invention is used to investigate the effect on the RO frequency degradation of any MOSFET DC degradation mechanism of interest, as well as the effect of AC voltage waveforms known to be representative of a critical circuit operation. The dependence of the RO frequency on the device degradation mechanisms activated during a critical circuit operation can be carefully investigated and quantified. This RO circuit provides an important tool in establishing a tradeoff between aggressive circuit design, device design optimization and MOSFET device reliability. A correlation between the RO frequency degradation and both PMOSFET and NMOSFET device DC parameters can be easily established.

The RO circuit can be integrated in any wafer level reliability (WLR) scheme to estimate the dependence of the RO frequency degradation in a MOSFET device to a worst case DC degradation. As such, it can be used as an in-line monitor of the performance degradation sensitivity of a given device design or CMOS process to a worst case circuit sensitive device reliability degradation mechanism.

In a second aspect of the invention, there is provided a method of determining the effect of the degradation of MOSFET on the frequency of a Ring Oscillator (RO) consisting of an odd prime number of inverter stages, each of the inverters stages having an NMOS and a PMOS field-effect transistor, the method including the steps of: a) selecting one inverter from the inverter stages of the RO, the selected inverter having testable nodes, the testable nodes being connected to inputs and outputs of the NMOS and a PMOS field-effect transistors forming the selected inverter; b) simultaneously stressing under a set of stress conditions 1) all of the NMOS FETs of each of the inverter stages, 2) all of the PMOS field-effect transistors and 3) all of the NMOS and PMOS FETs in the RO; c) measuring a shift in selected device parameters in the selected inverter; d) measuring a frequency degradation of the entire RO; and e) establishing a relationship between the shift in the device parameters and the frequency degradation and relating the relationship to a known degradation mechanism.

In a third aspect of the invention there is provided a method of determining during wafer level stressing and testing, the effect of the degradation of MOSFET on the frequency Oscillator (RO) consisting of an odd prime number of inverter stages, each of the inverters stages having an NMOS and a PMOS field-effect transistor, the method including the steps of: a) selecting one inverter from the inverter stages of the RO, the selected inverter having testable nodes, the testable nodes being connected to inputs and outputs of the NMOS and a PMOS field-effect transistors forming the selected inverter; b) simultaneously stressing under a set of stress conditions 1) all of the NMOS FETs of each of the inverter stages, 2) all of the PMOS field-effect transistors and 3) all of the NMOS and PMOS FETs in the RO; c) measuring a shift in selected device parameters in the selected inverter; d) measuring a frequency degradation of the entire RO; and e) establishing a relationship between the shift in the device parameters and the frequency degradation and relating the relationship to a known degradation mechanism, wherein stressing and testing of the wafer is performed under accelerated stress conditions to meet a predetermined device reliability target.

BRIEF DESCRIPTION OF THE DRAWINGS

The foregoing and other objects, aspects and advantages of the invention will become apparent from the following detailed description of a preferred embodiment of the invention when taken in conjunction with the accompanying drawings.

DETAILED DESCRIPTION OF THE PREFERRED EMBODIMENT

To better quantify the effects of critical MOSFET degradation mechanisms to chip performance, parameterized by the frequency of the RO, a design has been provided to build a new Ring Oscillator circuit, in accordance with the invention.

Figure 8:
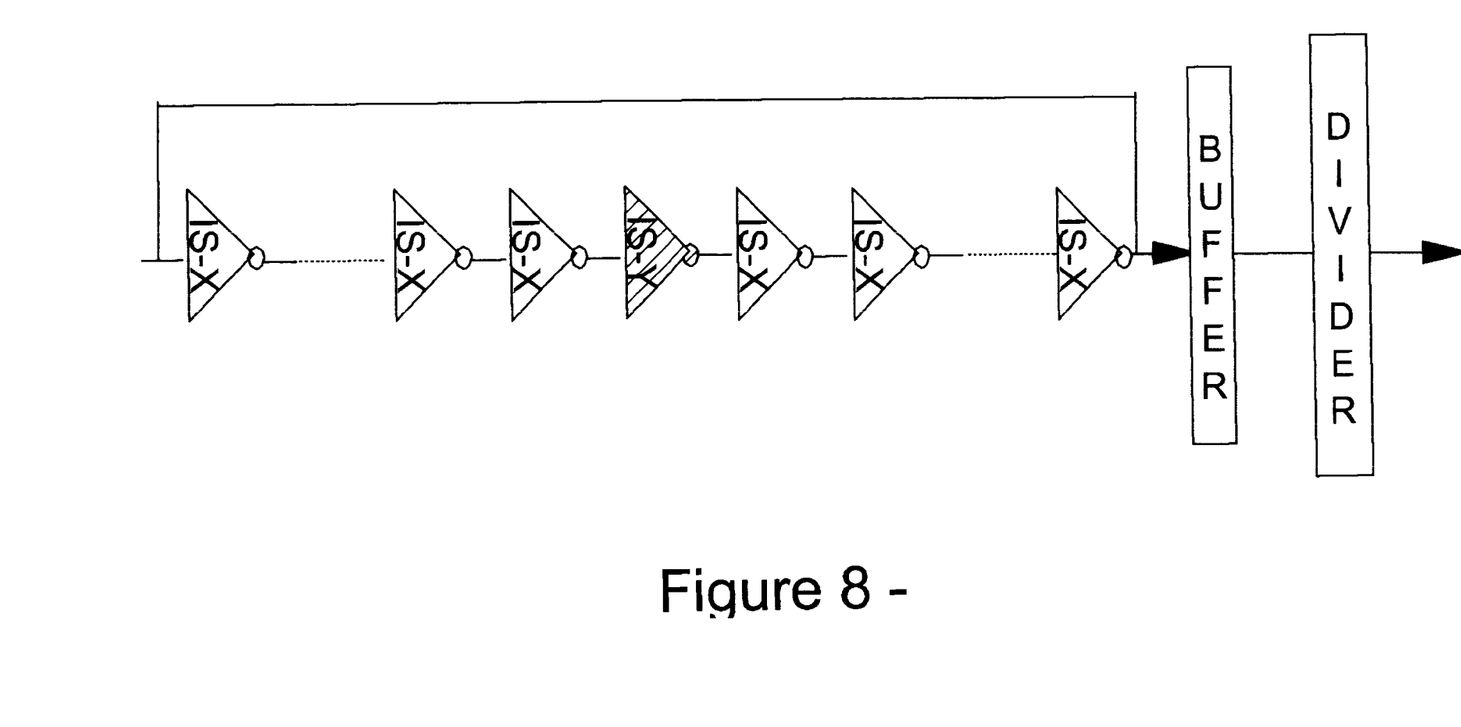
FIG. 8 is a schematic of an RO according to the present invention. The inverter stages IS-X and IS-Y are structurally similar. The IS-Y inverter stage executes the testing/stressing, while IS-X performs only stress operations. The buffer and divider circuits provide the frequency measurements

Referring to FIG. 8, there is shown the Ring Oscillator circuit of the invention consisting of two types of inverter stages, X (IS-X) and Y (IS-Y), each having the same array of pass gates to activate the input voltage signals and adapted for stressing and testing purposes. The IS-X and IS-Y inverters are structurally the same and consist of identical groups of NMOSFET and PMOSFET devices as well as the same array of pass gates (PS#), but performing different operations (see FIGS. 10–11).

Figure 9:
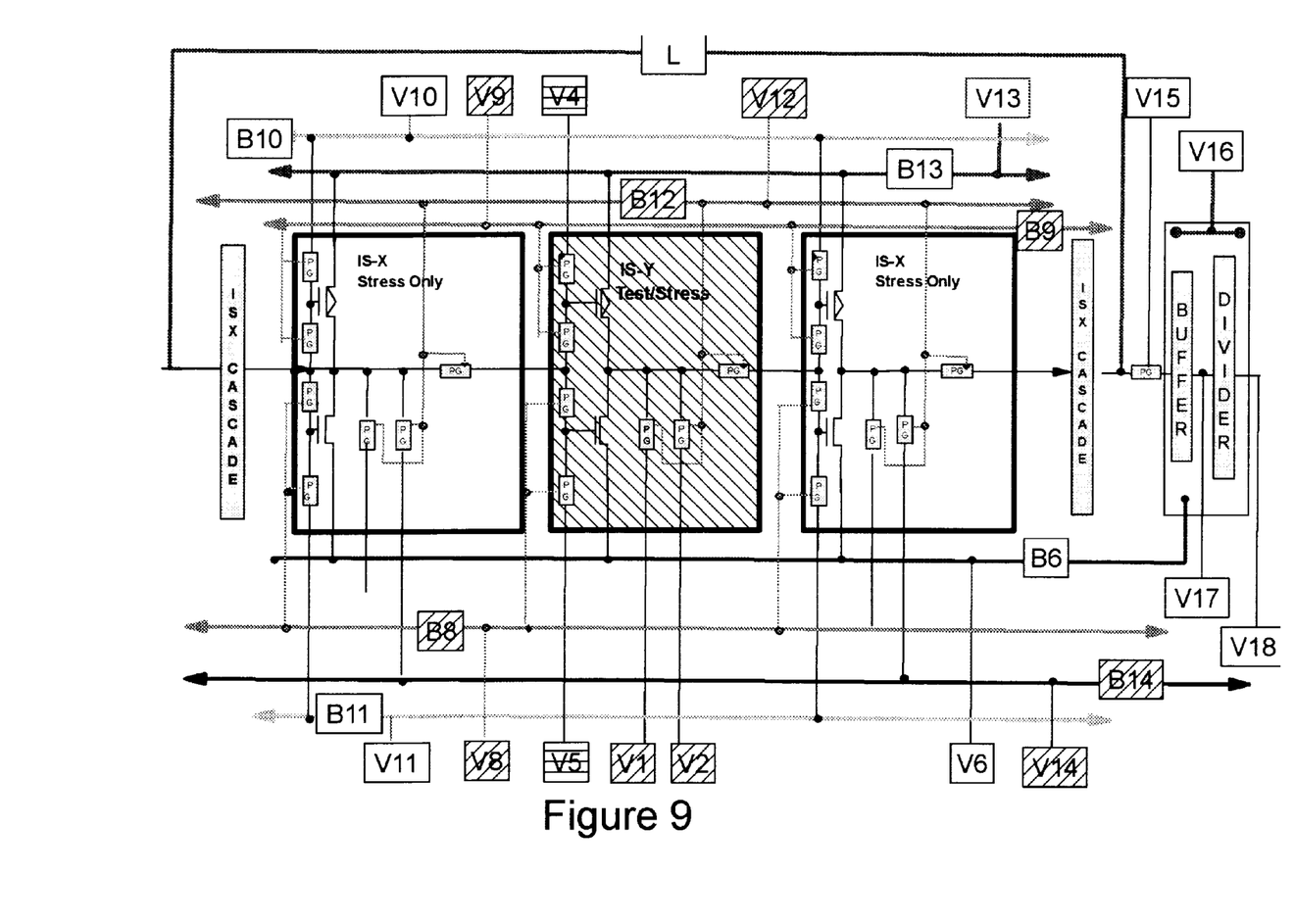
FIG. 9 shows a schematic diagram of the RO in accordance with the present invention in the region surrounding the IS-Y inverted stage, wherein all the input nodes of each RO element are given.

FIG. 9 describes the main components of the inventive RO circuit. All the inverter stages but one IS-Y are of the same type IS-X. The total number of inverter stages (IS-X+ IS-Y) is any odd prime number of stages to allow the RO to "ring". FIG. 9 shows the inverter stage IS-Y surrounded by inverter stages IS-X on both sides. The IS-X cascade box represents a cascade of IS-X connected by the loop L. The circuit has also a buffer and a divider circuit in series with the RO output to perform the frequency measurements.

Figure 10:
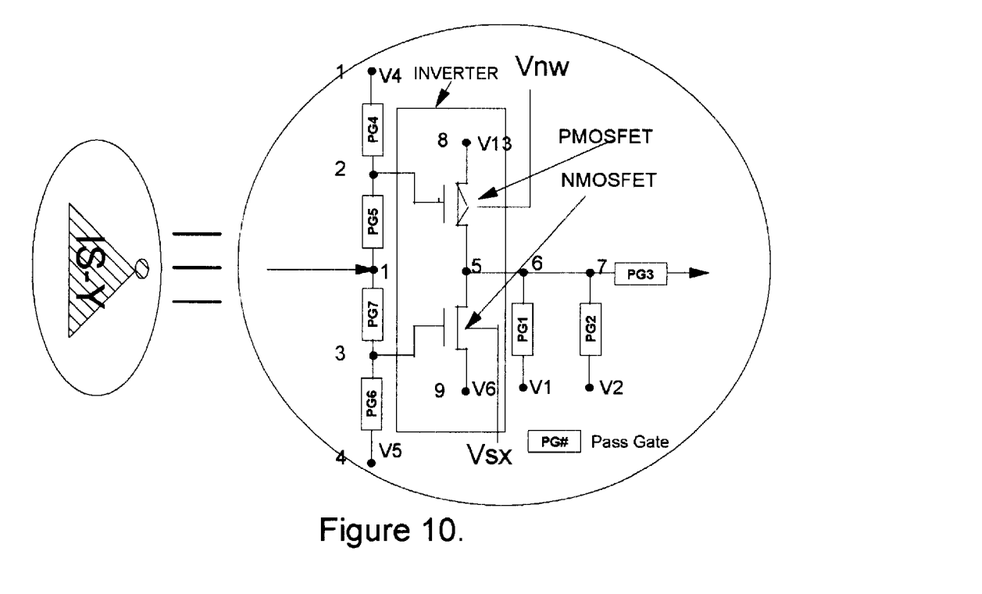
FIG. 10 illustrates an overview of the inverter stage IS-Y. Seven pass gates are used to allow the testing or stressing procedures. The voltage V4, V5, V1 and V2 are applied only to IS-Y. Vnw and Vsx are, respectively, the Nwell and substrate bias applied to the devices.
Figure 11:
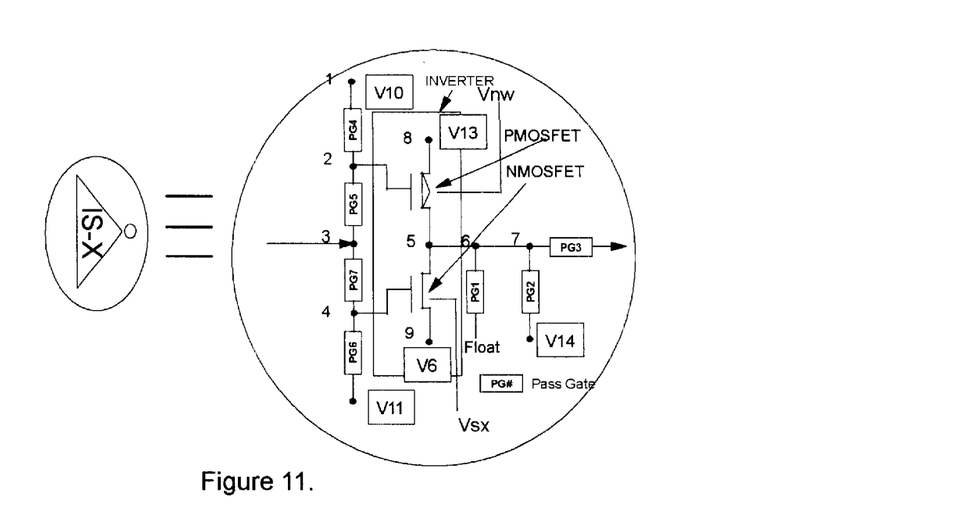
FIG. 11 shows an overview of the inverter stage IS-X. Seven pass gates are used for stressing procedures. The voltage V10, V11, V13 and V6 are applied in parallel to all IS-X inverter stages. Vnw and Vsx are, respectively, the Nwell and substrate bias applied to the devices.

Table 1 shown hereinafter provides a list of the input nodes and associated voltages used for testing and stressing each element of the RO. Table 1 describes how a given input (V#) activates a particular element of the RO. If a direct measurement of the RO frequency is needed, the output of the buffer circuit,V17, can be connected to a frequency measurement apparatus. The divider output V18, is used to measure the RO frequency reduced by a 1024 factor. Each Inverter stage (IS-X and IS-Y) consists of three groups of pass gates. The pass gates PG3 are complement of passgates PG1 and PG2, i.e., if the PG3 is closed, then both PG1 and PG2 are open and vice versa. Pass gates PG5 and PG7 are complements of PG4 and PG6, respectively (FIGS. 10–11). Both inverter stages IS-X and IS-Y have common buses B13 and B6 that apply, respectively, Vdd to node 8 by way of input V13 and voltage Vcc to node 9 by way of input V6. The inverter stages IS-X use common bus B10 to apply a gate voltage to node 2 of the PMOSFET device by way of input V10, and bus B11 to apply a gate voltage to node 3 of the NMOSFET device by means of input V11. Nodes 2 and 3 of inverter stage IS-Y are individually connected to inputs V4 (Vdd) and V5 (Vcc), respectively. In both cases, biases are applied to nodes 2 and 3 once pass gates PG4 and PG6 are switched off.

The main difference between the two types of inverter stages (IS-X and IS-Y) consists in the different type of stress and testing operations that can be carried out with each one of them. To better understand these differences, stress/test conditions for the IS-X and IS-Y inverter stages are provided hereinafter.

TABLE 1

| Input Voltages | Use |
| --- | --- |
| V1 | Sense voltage at node 6 of IS-Y |
| V2 | Apply voltage to node 7 of IS-Y/Measure current |
| V4 | Apply voltage to node 2 of IS-Y |
| V5 | Apply voltage to node 3 of IS-Y |
| V6 | Apply voltage (Vcc) to node 9 in both inverters IS-X and IS-Y<br>Apply voltage (Vcc) to buffer and divider<br>Bus 6 (B6) is used to link all the nodes of IS-X and IS-Y |
| V8 | Activate pass gates PG6 and PG7 in both inverters IS-X and IS-Y<br>PG6 is complement to PG7<br>Bus 8 (B8) is used to activate the pass gates in parallel |
| V9 | Activate pass gates PG4 and PG5 in both inverters IS-X and IS-Y<br>PG4 is complement to PG5<br>Bus 8 (B8) is used to activate the pass gates in parallel |
| V10 | Apply voltage to node 2 in inverter IS-X<br>Apply voltage to gate of PMOSFET in IS-X |
| V11 | Apply voltage to node 4 in inverter IS-X<br>Apply voltage to gate of NMOSFET in IS-X |
| V12 | Activate pass gates PG1, PG2 and PG3 in inverters IS-X and IS-Y<br>PG3 is complement to PG1 and PG2<br>Bus 12 (B12) is used to activate the pass gates in parallel |
| V13 | Apply voltage (Vdd) to node 8 in both inverters IS-X and IS-Y<br>Bus 13 (B13) is used to link all the nodes of IS-X and IS-Y |
| V14 | Apply voltage to node 7 of IS-X/Measure current |
| V15 | Activate the input pass gate of the buffer. |
| V16 | Apply Voltage (Vdd) to buffer and divider |
| V17 | Measure RO frequency out of buffer |
| V18 | Measure RO frequency out of divider |

Five different operations are possible with this RO design: Two test operations (MOSFET device parameters measurements and RO frequency measurements) and three stress operations: i.e., simultaneous DC constant voltage, AC off-chip stress of the MOSFET devices in each inverter stage, and RO frequency stress. Following are described the aforementioned five operations.

A) Test Procedures:

The RO circuit of the invention provides two possible test modes, namely, DC testing of any MOSFET device characteristics of the invert stage IS-Y and a frequency measurement of the RO. No direct measurements of the parameters of MOSFETs of the inverter stage IS-X are possible.

Device Measurements of MOSFETs of IS-Y

The independent measurement of each MOSFET device in the inverter stage IS-Y is carried out by applying appropriate voltages to the three inputs V2, V4 and V5, as well as to inputs V13 and V6 shared by the IS-X s (FIG. 10). The input V1 is used to sense the voltage at node V5. MOSFET device characteristics are extracted by measuring the drain current, the bulk current and the gate current of the MOSFET of interest.

Figure 12:
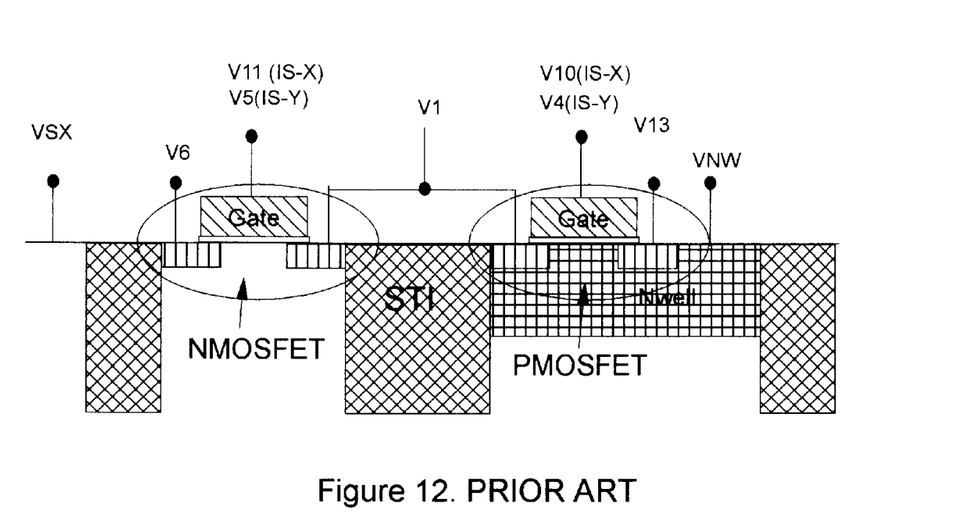
FIG. 12 is a cross-sectional view of the NMOSFET and PMOSFET devices of the inverter stages IS-X wherein the input biases for each node and inverter are also given.

The following conditions are given to simplify the description of the testing procedures (FIG. 12):

Vds(NMOS/IS-Y)=V1−V6, Vgs(NMOS/IS-Y)=V5−V6, Vsx,s (NMOS/IS-Y)=Vsx−V6

Vds(PMOS/IS-Y)=V1−V13, Vgs(PMOS/IS-Y)=V4−V13, Vnw,s (PMOS/IS-Y)=Vnw−V13

NMOS drain current=ld(NMOS)=Current measured at V2.

NMOS bulk current=lsx(NMOS)=Current measured at Vsx.

NMOS gate current=lg(NMOS)=Current measured at V5.

PMOS drain current=ld(PMOS)=Current measured at V2.

PMOS Nwel current=lnw(PMOS)=Current measured at Vnw.

PMOS gate current=lg(PMOS)=Current measured at V4.

While measurements of the device characteristics of given MOSFET device are taken, the second device is turned off. Thus, Vgs(PMOS)>0 when testing the NMOS, and Vgs(NMOS)>0 when testing the PMOS.

The pass gates are activated in a way to isolate the inverter IS-Y from the rest of the RO and to apply the voltage biases and measuring the currents in the MOSFET of interest, as will be described hereinafter. The following bias configurations characterize either the NMOSFET or the PMOSFET device in the inverter stage IS-Y.

Measuring NMOSFET currents in IS-Y (TEST NMOSFET—TEST1)

The necessary conditions are:

1) Set V12=0, V9=V8=Vdd (PG3=PG5=PG7=open, PG1=PG2=PG4=PG6=closed)

2) Set Vgs(PMOS) >0, Vds(PMOS)=0, Vnw,s(PMOS)=0 (PMOSFET is turned off)

3) Set Vds(NMOS), Vgs(NMOS), Vsx,s(NMOS) for the test mode of interest (i.e., linear or saturation mode) of the NMOSFET device.

4) Measure ld(NMOS), lg(NMOS), lsx(NMOS).

5) Extract the device parameters (Vth, Ion,Ioff etc)

Measuring PMOSFET currents in IS-Y (TEST NMOSFET—TEST2)

The setup is as follows:

1) Set V12=0, V9=V8=Vdd (PG3=PG5=PG7=open, PG1=PG2=PG4=PG6=closed)

2) Set Vgs(NMOS) <0, Vds(NMOS)=0, Vnw,s (NMOS)=0 (NMOSFET is turned off)

3) Set Vds(PMOS), Vgs(PMOS), Vsx,s(PMOS) for the test mode of interest (linear or saturation mode) of the POSFET device.

4) Measure ld(PMOS), lg(PMOS), lsx(PMOS).

5) Extract the device parameters (Vth, Ion,Ioff etc)

Ring Oscillator Frequency Measurement. (TEST 3).

The frequency measurement of the RO is carried out under the following conditions:

1) Close the loop L of RO (close the pass gate PG3 in all the inverters). Set V12=Vdd,V9=V5=0 (PG3=PG5=PG7=closed, PG1=PG2=PG5=PG7=open)

2) Connect the gates of both the PMOSFET and NMOSFET of each inverter (close the pass gates PG5 and PG7)

3) Apply Vdd to the input PFET node (V13) as well Vnw=Vdd.

4) Apply Vcc to the input NFET node (V6) as well Vsx=Vcc.

5) Measure the RO frequency from the divider output V18, by closing the pass gate connected to V15 and activating the buffer and divider circuits (V16=Vdd).

This operation makes it possible to measure the RO frequency as a function of Vdd.

B) RO Stressing procedures:

The RO circuit of the present invention provides three types of stressing procedures, i.e. parallel constant voltage stress of a given MOSFET in every inverter stage (IS-X and IS-Y) of the RO; a parallel off-chip AC voltage stress of each inverter stage (IS-X+IS-Y) of the RO, and RO frequency induced degradation. Under the stated stress conditions, both IS-X and IS-Y inverter stages are stressed simultaneously under the same bias conditions.

Constant Voltage Stresses in a Given MOSFETs of both IS-Y and IS-X Inverter Stages.

The constant voltage stress is carried out by applying the same voltage biases on a given MOSFET device in both inverter stages IS-X and IS-Y. The pass gates are activated in a way to isolate during stress the inverters from each other and to allow the application of the stress voltage biases on the MOSFET device of interest.

The inverter stage IS-Y is stressed by applying appropriate voltages to the three inputs (V2, V4 and V5 ) as well as to input V13 and V6 shared by the IS-X s (FIG. 10). The input (V1) is used to sense the voltage at node V5 .

The following definitions are given to simplify the description of the testing procedures (FIG. 12):

Vds(NMOS/IS-Y)=V1−V6, Vgs(NMOS/IS-Y)=V5−V6, Vsx,s (NMOS/IS-Y)=Vsx−V6

Vds(PMOS/IS-Y)=V1−V13, Vgs(PMOS/IS-Y)=V4−V13, Vnw,s (PMOS/IS-Y)=Vnw−V13

Vds(NMOS/IS-X)=V1−V6, Vgs(NMOS/IS-X)=V11−V6, Vsx,s (NMOS/IS-X)=Vsx−V6

Vds(PMOS/IS-X)=V−V13, Vgs(PMOS/IS-X)=V4−V13, Vnw,s (PMOS/IS-X)=Vnw−V13

The following bias configurations stress either one of the NMOSFET or the PMOSFET devices in the both inverter stages IS-Y and IS-X.

DC Constant Voltage/AC Voltage Stress of the NMOSFET Devices in each Inverter Stage (IS-Y and IS-X) (STRESS NMOSFET)

The conditions for this procedure are:

1) Set V12=0, V9=V8=Vdd (PG3=PG5=PG7=open, PG1=PG2=PG4=PG6=closed)

2) Set Vgs(PMOS/IS-X)=Vgs(PMOS/IS-Y) >0, Vds (PMOS/IS-X)=Vds(PMOS/IS-Y)=0, Vnw,s(PMOS/IS-X)=Vnw,s(PMOS/IS-X)=0 (PMOSFET is turned off)

3) Set Vds(NMOS/IS-X)=Vds(NMOS/IS-X)=Vds at stress condition, Vgs(NMOS/IS-X)=Vgs(NMOS/IS-X)=Vgs at stress condition, Vsx,s(NMOS/IS-X)=Vsx,s(NMOS/IS-X)=Vsx at stress condition.

The above biases are adjusted to activate a given NMOSFET degradation mechanism under DC conditions. During AC off-chip stressing, Vds is constant, Vsx is constant, and Vgs is subjected to the voltage waveform. DC Constant Voltage/AC Voltage Stress of the PMOSFET Devices in each Inverter Stage (IS-Y and IS-X) (STRESS PMOSFET)

The conditions are as follows:

1) Set V12=0, V9=V8=Vdd (PG3=PG5=PG7=open, PG1=PG2=PG4=PG6=closed)

2) Set Vgs(NMOS/IS-X)=Vgs(NMOS/IS-Y) <0, Vds (NMOS/IS-X)=Vds(NMOS/IS-Y)=0, Vnw,s(NMOS/IS-X)=Vnw,s(NMOS/IS-X)=0 (NMOSFET is turned off)

3) Set Vds(PMOS/IS-X)=Vds(PMOS/IS-X)=Vds at stress condition, Vgs(PMOS/IS-X)=Vgs(PMOS/IS-X)=Vgs at stress condition, Vnw,s(PMOS/IS-X)=Vnw,s (PMOS/IS-X)=Vnw at stress condition, The above biases are adjusted to activate a given PMOS-FET degradation mechanism under DC conditions. During AC off-chip stressing, Vds is constant, Vnw is constant, and Vgs is subjected to the voltage waveform Ring Oscillator Frequency Stress.

This condition makes the RO to be stressed as in a standard RO stress procedures. The RO frequency stress induced degradation of the RO is carried out as follows:

1) Close the loop L of RO (close the pass gate PG3 in all the inverters). Set V12=Vdd,V9=V5=0 (PG3=PG5= PG7=closed, PG1=PG2=PG5=PG7=open)

2) Connect the gates of both the PMOSFET and NMOSFET of each inverter (close the pass gates PG5 and PG7)

3) Apply Vdd to the input PFET node (V13) as well Vnw=Vdd.

4) Apply Vcc to the input NFET node (V6) as well Vsx=Vcc.

5) Measure the RO frequency from the divider output V18, by closing the pass gate connected to V15 and activating the buffer and divider circuits (V161=Vdd).

This measurement makes it possible to measure the RO frequency as a function of Vdd.

Figure 13:
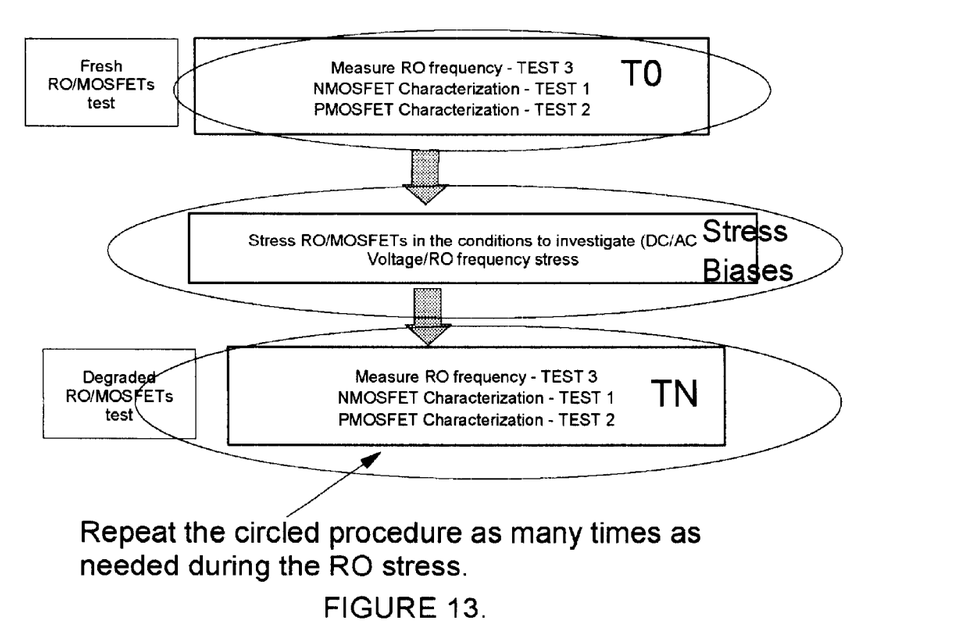
FIG. 13 shows a flowchart of procedures to test and stress the RO.

Referring now to the flow chart illustrated in FIG. 13, an example is provided of a stress/test sequence that characterizes the dependence between the RO frequency degradation and a predetermined degradation mechanism.

The invention provides, among others, an easy way to characterize the RO frequency and the device parameters degradation of a given MOSFET (part of IS-Y) as a result of stress conditions which activate a specific device degradation mechanism. The tests (test 1, 2, 3) and stress modes (stress NMOSFET, stress PMOSFET, RO frequency stress) described previously can be used in a possible stress/test sequence that achieves the stated objective.

As previously stated, the main objective of a reliability stress activity is to determine the impact of a given stress mode on the parameters characterizing the structure under investigation. In the present case, characterizing the MOSFET parameters and the RO frequency degradation during stress is achieved by periodically stopping the stress to test certain device parameters under conditions of particular interest. The step TN indicates the test sequence at stress interruption point N. This sequence consists of a combination of: measuring the RO frequency (test 3), determining the NMOSFET device parameters (test 1) and PMOSFET device parameters (test 2) described above. The stress is interrupted as often as required.

Before initiating the stress operation, a full characterization is performed of the MOSFETS integral to IS-Y, including the RO frequency This sequence is described in step TO. A comparison between the characterization of TO and TN determines the degradation of the MOSFETs integral to IS-Y as well the RO frequency at step N. Upon completion of the TO sequence, the stress is initiated at the condition of interest (i.e., stress biases) and interrupted at several points N.

Figure 14:
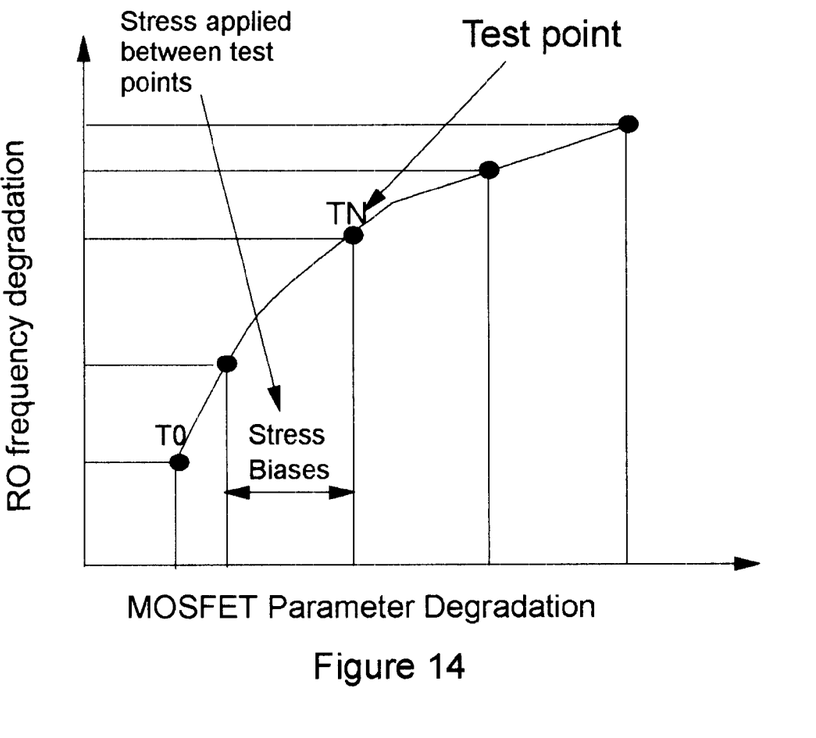
FIG. 14 shows the expected outcome of the stress/test sequence illustrated in FIG. 13, and more specifically, a qualitative description of the RO frequency degradation and DC MOSFET parameters shifts as result of applying a stress/test sequence to the RO, according to the invention.

FIG. 14 describes the expected outcome of the stress/test sequence. The possibility of quantifying the sensitivity of RO frequency degradation as a function of the MOSFET device parameters degradation under DC or AC stress conditions is a definitive advantage of the invention.

Whereas the invention has been described in terms of a preferred embodiment, those skilled in the art will recognize that the invention can be practiced with changes and modifications, all of which fall within the scope and the spirit of the appended claims

Having thus described the invention, what is claimed and desired to protect by Letters Patent is as follows:

1. A method of measuring degretion of a Ring Oscllator (RO) having an odd prime number of server Stages each of the inverter stages having an NMOS and a PMOS field transistor, each of said NMOS and PMOS fieldeffect transistors having an input and an output respectively accessible by pass gate activation, the method comprising the steps of:
   a) simultaneously stressing under a set of stress conditions devices selected from the group consisting of: each NMOS field-effect transistor of all of said inverter stages of said RO, each PMOS fieldefibar transistor of all of the inventer stages of said RO, and each NMOS and PMOS field-effect transistors of all of said inverter stages of said RO;
   b) measuring a paraer shift of the selected device under stress in a selected inverter stage;
   c) measuring the frequency degradation of said RO, and
   d) establishing a relationship between said parameter shift of said device under stress in said selected inverter stage and said frequency degradation, and relating said relate to a known degradation mechanism activated by said set of stress conditions.

2. The method as recited in claim 1, wherein said stress conditions are selected from the group consisting of channel conducting hot carriers channel non-conducting hot carriers, negative bias temperature instability, positive temperature bias instability and gate induced drain leakage (CDL).

3. The method as recited in claim 1, wherein said stressing further comprises AC and DC voltage stressing.

4. The method as recited in claim 3, wherein said stressing of each inverter stage of said RO is performed under a DC voltage and by disconnecting at least one inverter stage from an adjacent inverter stage thereby inhibiting said RO from oscillating.

5. The method as recited in claim 1, wherein said known degradation mechanism is obtained from burn-in stressing or from chip circuit operation under normal operating conditions.

6. The method as recited in claim 1, further comprising the step of classifying said degradation mechanisms and estimating an end-of-life contribution of said device degradation mechanisms to circuit performance.

7. The method as recited in claim 1, wherein said measuring said parameter shift and said frequency delegation of the entire RO is performed repeatedly at a plurality of time intervals.

8. The method as recited in claim 1, wherein said method of measuring a frequency degradation of a Ring Oscillator (RO) is performed at wafer level for in-line testing.

9. The method as recited in claim 8, wherein said stressing and testing of said wafer is performed under accelerated stress conditions to meet a predetermined device reliability target.

10. The method as recited in claim 8, wherein measuring said shift in selected device parameters and said frequency degradation of the said entire RO is performed at time intervals less than 10 seconds.

11. The method as recited in claim 8, wherein said frequency tion of said R0 is performed under DC voltage stress conditions which are measured at less than three time intervals less than 10 seconds.

12. The method as recited in claim 8, wherein the frequency degradation of said RO and the parameter shift of said device calibrate a device reliability simulator.

13. A method of measuring degradation of a Ring Oscillator (RO) having an odd prime number of inverter stages, each of the inverter stages having an NMOS and a PMOS field-effect transistor, each of said NMOS and PMOS field-effect transistors having an input and an output respectively accessible by pass gate activation, the method comprising the steps of;

a) under any DC or AC voltage conditions, simultaneously stressing devices selected from the group consisting of each NMOS field-effect transistor of all of said inverter stages of said RO, each PMOS field-effect transistor of all of said inverter stages of said RO, and each NMOS and PMOS field-effect transistors of all of said inverter stages of said RO;

b) measuring a parameter shift of the selected device under stress in a selected inverter stage, c) measuring the frequency degradation of said RO; and d) establishing a relationship between said parameter sift of said device under stress in said selected inverter stage and sad frequency delegation, and relax said relationship to a known delegation mechanism activated by said set of stress conditions.

* * * * *